(12) United States Patent
Fujino (10) Patent No.: US 11,955,939 B2
(45) Date of Patent: Apr. 9, 2024

(54) CONTROL DEVICE, CONTROL METHOD, AND RECORDING MEDIUM

(71) Applicant: Panasonic Intellectual Property Management Co., Ltd., Osaka (JP)

(72) Inventor: Toshihiro Fujino, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 137 days.

(21) Appl. No.: 17/791,776

(22) PCT Filed: Aug. 13, 2020

(86) PCT No.: PCT/JP2020/030824
§ 371 (c)(1),
(2) Date: Jul. 8, 2022

(87) PCT Pub. No.: WO2021/215025
PCT Pub. Date: Oct. 28, 2021

(65) Prior Publication Data
US 2023/0033959 A1 Feb. 2, 2023

(30) Foreign Application Priority Data

Apr. 22, 2020 (JP) ................................. 2020-076221

(51) Int. Cl.
*H03G 3/30* (2006.01)
*H04R 3/04* (2006.01)

(52) U.S. Cl.
CPC ............ *H03G 3/3005* (2013.01); *H04R 3/04* (2013.01); *H03G 2201/103* (2013.01); *H04R 2430/01* (2013.01)

(58) Field of Classification Search
CPC ....... H04R 3/04; H04R 2430/01; H04S 7/307; H03G 3/3005; H03G 5/165

(Continued)

(56) References Cited

U.S. PATENT DOCUMENTS 5,541,866 A * 7/1996 Sato .................. H03H 17/0294
381/103
7,483,540 B2 * 1/2009 Rabinowitz ............. H04R 3/04
381/103

(Continued)

FOREIGN PATENT DOCUMENTS

JP 2007-206636 A 8/2007
JP 2007-295528 A 11/2007

OTHER PUBLICATIONS

International Search Report dated Nov. 2, 2020 in International Patent Application No. PCT/JP2020/030824, with English translation.

(Continued)

*Primary Examiner* — Xu Mei
(74) *Attorney, Agent, or Firm* — Rimon P.C.

(57) ABSTRACT

A control device includes: a difference calculator that calculates a maximum gain difference between frequency characteristics of an audio signal and desired frequency characteristics in a predetermined frequency band; a center frequency calculator that calculates a center frequency between a first frequency at which the gain difference is $1/\sqrt{2}$ times the maximum gain difference and which is closest to a peak frequency corresponding to the maximum gain difference among one or more frequencies lower than the peak frequency and a second frequency at which the gain difference is $1/\sqrt{2}$ times the maximum gain difference and which is closest to the peak frequency among one or more frequencies higher than the peak frequency; a determiner that determines parameters of an equalizer based on the maximum gain difference and the center frequency; and an outputter that outputs the parameters to the equalizer.

5 Claims, 6 Drawing Sheets

(58) Field of Classification Search
USPC .................. 381/103, 98; 333/28 R; 708/323
See application file for complete search history.

(56) References Cited

U.S. PATENT DOCUMENTS

| | | | | |
|---|---|---|---|---|
| 8,150,069 B2* | 4/2012 | Nakano | ................. | H03G 5/165 |
| | | | | 381/103 |
| 8,199,932 B2* | 6/2012 | Nakano | ................... | H04S 7/301 |
| | | | | 381/103 |
| 2006/0153404 A1* | 7/2006 | Gardner | ................ | H03G 5/005 |
| | | | | 381/103 |
| 2007/0133823 A1* | 6/2007 | Nakano | .................... | H04S 7/00 |
| | | | | 381/103 |
| 2007/0230556 A1 | 10/2007 | Nakano | | |
| 2008/0037805 A1* | 2/2008 | Kino | ...................... | H04S 7/301 |
| | | | | 381/101 |

OTHER PUBLICATIONS

Extended European Search Report dated Sep. 15, 2023 issued in the corresponding European Patent Application No. 20931976.3.

* cited by examiner

CONTROL DEVICE, CONTROL METHOD, AND RECORDING MEDIUM

CROSS-REFERENCE OF RELATED APPLICATIONS

This application is the U.S. National Phase under 35 U.S.C. § 371 of International Patent Application No. PCT/JP2020/030824, filed on Aug. 13, 2020, which in turn claims the benefit of Japanese Application No. 2020-076221, filed on Apr. 22, 2020, the entire disclosures of which applications are incorporated by reference herein.

TECHNICAL FIELD

The present disclosure relates to a control device, a control method, and a recording medium that control an equalizer.

BACKGROUND ART

A conventional device has been disclosed that sets parameters for an equalizer (e.g., parametric equalizer (PEQ)) that adjusts (corrects) the frequency characteristics of an audio signal, and corrects the frequency characteristics of the audio signal by adjusting the audio signal by the equalizer in which the parameters are set so as to approximate the frequency characteristics of the audio signal to desired frequency characteristics (e.g., Patent Literature (PTL) 1). Specifically, the device sets the PEQ center frequency of the equalizer to a peak frequency, which is a frequency at which gain difference between the frequency characteristics of the audio signal and desired frequency characteristics is maximum. The device sets the gain of the equalizer to a gain difference at the peak frequency, and sets the Q value of the equalizer with reference to a frequency at which the gain difference is $1/\sqrt{2}$ times the gain difference at the peak frequency.

CITATION LIST

Patent Literature

[PTL 1] Japanese Unexamined Patent Application Publication No. 2007-206636

SUMMARY OF INVENTION

Technical Problem

For example, the frequency characteristics of an audio signal are not always symmetrical about the peak frequency. For example, the frequency characteristics of an audio signal may be asymmetrical about the peak frequency on the frequency axis. Such asymmetric frequency characteristics include (i) a frequency which is lower than the peak frequency and at which the gain difference is $1/\sqrt{2}$ times the gain difference of the peak frequency on one side, and (ii) a frequency which is higher than the peak frequency and at which the gain difference is $1/\sqrt{2}$ times the gain difference of the peak frequency on the other side. In this case, when the audio signal is corrected by the equalizer, the audio signal is corrected too much at a certain frequency or not corrected enough at a certain frequency. For this reason, there is a problem that a large number of bands (e.g., PEQ bands) are required in the equalizer to approximate the frequency characteristics of the audio signal to desired frequency characteristics.

The present disclosure provides a control device and so on that can reduce the number of bands of an equalizer required for correction.

Solution to Problem

A control device according to the present disclosure includes: a difference calculator that calculates a maximum gain difference between frequency characteristics of an audio signal and desired frequency characteristics in a predetermined frequency band; a center frequency calculator that calculates a center frequency between a first frequency and a second frequency, the first frequency being a frequency at which a gain difference between the frequency characteristics of the audio signal and the desired frequency characteristics is $1/\sqrt{2}$ times the maximum gain difference and which is closest to a peak frequency among one or more frequencies lower than the peak frequency, the second frequency being a frequency at which a gain difference between the frequency characteristics of the audio signal and the desired frequency characteristics is $1/\sqrt{2}$ times the maximum gain difference and which is closest to the peak frequency among one or more frequencies higher than the peak frequency, the peak frequency being a frequency at which the maximum gain difference is obtained; a determiner that determines parameters of an equalizer that adjusts the frequency characteristics of the audio signal based on the maximum gain difference and the center frequency; and an outputter that outputs the parameters to the equalizer.

A control method according to the present disclosure includes: calculating a maximum gain difference between frequency characteristics of an audio signal and desired frequency characteristics in a predetermined frequency band; calculating a center frequency between a first frequency and a second frequency, the first frequency being a frequency at which a gain difference between the frequency characteristics of the audio signal and the desired frequency characteristics is $1/\sqrt{2}$ times the maximum gain difference and which is closest to a peak frequency among one or more frequencies lower than the peak frequency, the second frequency being a frequency at which a gain difference between the frequency characteristics of the audio signal and the desired frequency characteristics is $1/\sqrt{2}$ times the maximum gain difference and which is closest to the peak frequency among one or more frequencies higher than the peak frequency, the peak frequency being a frequency at which the maximum gain difference is obtained; determining parameters of an equalizer that adjusts the frequency characteristics of the audio signal based on the maximum gain difference and the center frequency; and outputting the parameters to the equalizer.

A recording medium according to the present disclosure is a non-transitory computer-readable recording medium for use in a computer, the recording medium having a program recorded thereon for causing the computer to execute the control method described above.

Advantageous Effects of Invention

The control device and so on according to the present disclosure can reduce the number of bands of an equalizer required for correction.

DESCRIPTION OF EMBODIMENTS

Hereinafter, an embodiment will be described in detail with appropriate reference to the drawings. However, unnecessarily detailed description may be omitted. For example, detailed description of well-known matters or repeated description of essentially the same configurations may be omitted. This is to avoid unnecessary redundancy and make the following description easier for a person skilled in the art to understand.

Note that the inventor provides the accompanying drawings and the following description not to limit the subject matters recited in the claims but to aid a person skilled in the art to sufficiently understand the present disclosure.

EMBODIMENT

Hereinafter, an embodiment will be described with reference to FIG. 1 through FIG. 6.

Figure 1:
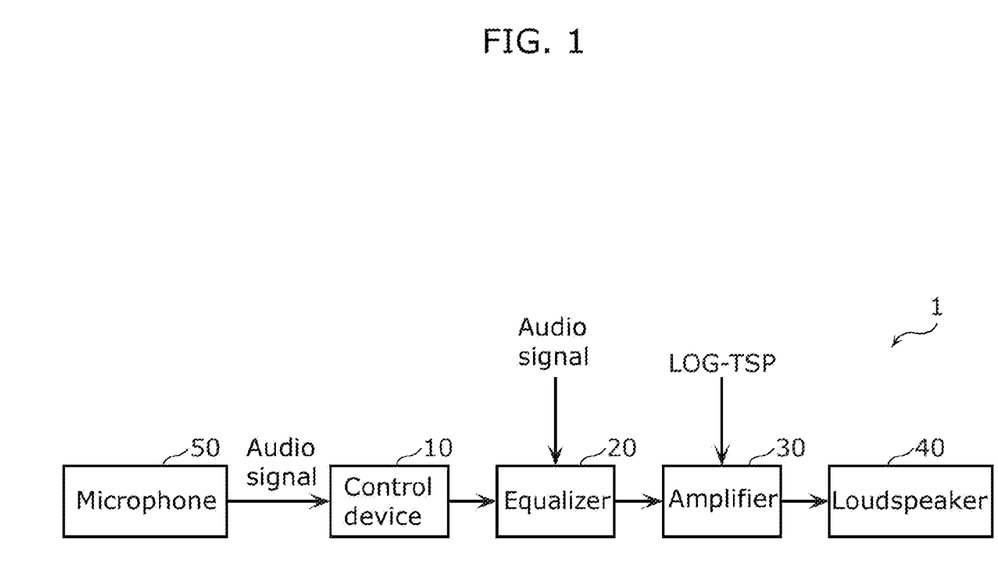
FIG. 1 is a diagram illustrating an example of a configuration of an audio playback system according to an embodiment.

FIG. 1 is a diagram illustrating an example of a configuration of audio playback system 1 according to the embodiment.

Audio playback system 1 is a system that plays back audio, and includes, for example, control device 10, equalizer 20, amplifier 30, loudspeaker 40, and microphone 50. For example, equalizer 20, amplifier 30, and loudspeaker 40 in audio playback system 1 are used during normal playback.

Equalizer 20 is, for example, a PEQ that adjusts the frequency characteristics of an audio signal. Equalizer 20 achieves a plurality of bands (e.g., PEQ bands), i.e., a filter, for adjusting the frequency characteristics of an audio signal. Examples of these filters include an infinite impulse response (IIR) filter, specifically, a peaking filter that increases or decreases a gain around a specific frequency, and a shelving filter that increases or decreases a gain in a frequency band higher or lower than a specific frequency. Equalizer 20 includes a plurality of bands because it is difficult to adjust the frequency characteristics of an audio signal over an entire specific frequency band that is wide, such as the audible band, for example. In other words, equalizer 20 can adjust the frequency characteristics of an audio signal over an entire specific frequency band by combining a plurality of bands.

Amplifier 30 amplifies an audio signal whose frequency characteristics have been adjusted by equalizer 20. Amplifier 30 may be, for example, a class D amplifier.

Loudspeaker 40 converts power of an audio signal output from amplifier 30 into acoustic energy and outputs the sound to a space.

When parameters of equalizer 20, specifically the parameters of the bands included in equalizer 20 are set, equalizer 20 can approximate the frequency characteristics of the input audio signal to desired frequency characteristics. The parameters of the bands included in equalizer 20 are, for example, a PEQ center frequency, a gain at the PEQ center frequency, and a Q value. For example, control device 10 and microphone 50 in audio playback system 1 are used when the parameters of equalizer 20 are calculated.

When the parameters of equalizer 20 are calculated, audio playback system 1 inputs, for example, a log-time stretched pulse (LOG-TSP) signal to amplifier 30, and outputs a sound corresponding to the amplified LOG-TSP signal from loudspeaker 40. A LOG-TSP signal is a signal having a relatively increased energy by stretching an impulse signal in the time direction. In a LOG-TSP signal, the frequency changes over time from a low frequency to a high frequency or from a high frequency to a low frequency. A LOG-TSP signal can be used to measure frequency characteristics (impulse response) of any system, as with an impulse signal.

Microphone 50 converts a picked-up sound into an electric signal and outputs a resultant electric signal. Microphone 50 picks up a sound corresponding to the LOG-TSP signal output from loudspeaker 40, converts the picked-up sound into an electric signal (audio signal), and outputs the electric signal to control device 10.

Control device 10 has a function of calculating the parameters of the bands included in equalizer 20, using the audio signal based on the sound corresponding to the LOG-TSP signal output from microphone 50. Control device 10 outputs the calculated parameters to equalizer 20 and sets the parameters in equalizer 20. Details of control device 10 will be described later with reference to FIG. 2.

Audio playback system 1 may be achieved by only an audio device or audio playback device such as a television, for example. In other words, control device 10, equalizer 20, amplifier 30, loudspeaker 40, and microphone 50 may be included in the casing of a single audio playback device. Audio playback system 1 does not need to be achieved by only a single audio playback device. Audio playback system 1 may be achieved by a plurality of devices. For example, audio playback system 1 may be achieved by an audio playback device and a mobile device (for example, a mobile terminal such as a smartphone or a tablet, or a remote controller for the audio playback device).

For example, the audio playback device may include control device 10, equalizer 20, amplifier 30, and loudspeaker 40. The mobile device may include microphone 50. In this case, a sound corresponding to the LOG-TSP signal that is picked up by microphone 50 of the mobile device is converted into an audio signal by the mobile device and the audio signal is transmitted through wireless or wired communication from the mobile device to the audio playback device. Control device 10 may be included in the mobile device. In this case, the sound corresponding to the LOG-TSP that is picked up by microphone 50 of the mobile device is converted into an audio signal by the mobile device, and parameters of equalizer 20 are calculated by the mobile device using the audio signal, and the calculated parameters are transmitted through wireless or wired communication from the mobile device to the audio playback device. For example, the mobile device that includes microphone 50 is placed at a specific location in a room, and microphone 50 included in the mobile device picks up the sound corresponding to the LOG-TSP signal. In this manner, the frequency characteristics of the audio signal at the location can be approximated to desired frequency characteristics.

During normal playback, an audio signal input to equalizer 20 is an audio signal obtained from, for example, a compact disc (CD) or digital versatile disc (DVD) set in the audio device, or from a broadcast signal received by a television. When the parameters of equalizer 20 are calculated, the audio signal is not input to equalizer 20. The audio signal that is input to control device 10 when the parameters of equalizer 20 are calculated is an audio signal based on the sound corresponding to the LOG-TSP signal that has been played back and picked up by microphone 50 to calculate the parameters of equalizer 20. During normal playback, control device 10 and microphone 50 are not used.

Figure 2:
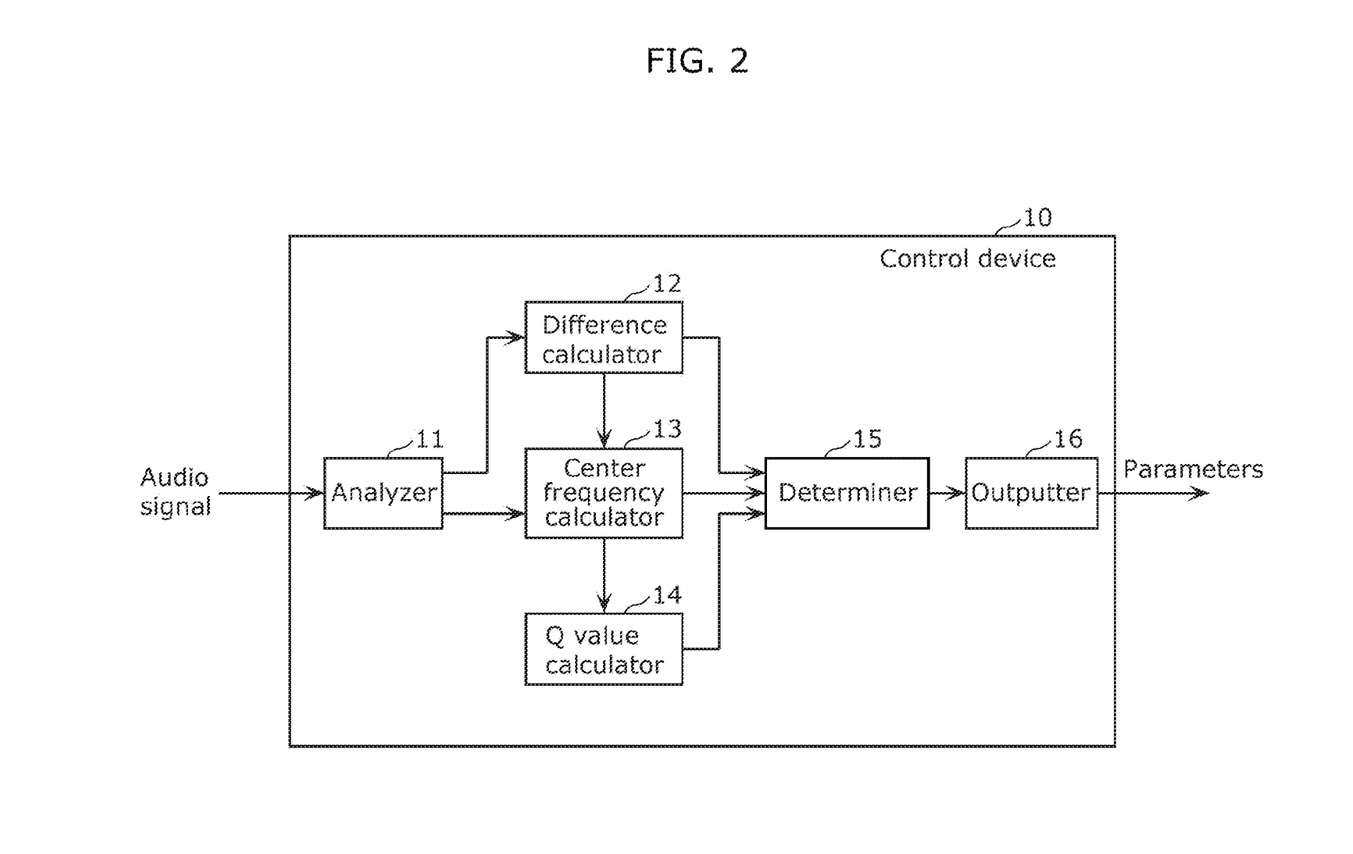
FIG. 2 is a diagram illustrating an example of a configuration of a control device according to the embodiment.

FIG. 2 is a diagram illustrating an example of a configuration of control device 10 according to the embodiment.

Control device 10 is, for example, a computer including a processor and memory. Memory is, for example, read-only memory (ROM) and random-access memory (RAM) that can store programs to be executed by the processor. Control device 10 includes analyzer 11, difference calculator 12, center frequency calculator 13, Q value calculator 14, determiner 15, and outputter 16. Analyzer 11, difference calculator 12, center frequency calculator 13, Q value calculator 14, determiner 15, and outputter 16 are each achieved by, for example, a processor that executes a program stored in the memory.

Analyzer 11 obtains the frequency characteristics of an audio signal input to control device 10 (i.e., an audio signal based on the sound corresponding to the LOG-TSP signal picked up by microphone 50) by performing fast Fourier transform (FFT) on the audio signal.

Difference calculator 12 calculates a value to be set as a gain at the PEQ center frequency of equalizer 20. Details of difference calculator 12 will be described later.

Center frequency calculator 13 calculates a value to be set as the PEQ center frequency of equalizer 20. Details of center frequency calculator 13 will be described later.

Q value calculator 14 calculates a value to be set as a Q value of equalizer 20. Details of Q value calculator 14 will be described later.

Determiner 15 determines parameters of equalizer 20. Details of determiner 15 will be described later.

Outputter 16 outputs the determined parameters to equalizer 20. This allows equalizer 20 to correct the audio signal with the bands formed with the determined parameters.

Next, details of operation of control device 10 will be described with reference to FIG. 3.

Difference calculator 12 calculates a maximum gain difference between the frequency characteristics of the audio signal and desired frequency characteristics in a predetermined frequency band (step S11). A predetermined frequency band is a portion of a whole predetermined frequency band that is wide, such as an audible band, for example. The desired frequency characteristics are frequency characteristics of the audio signal desired by, for example, a user, or frequency characteristics that are determined in advance as ideal frequency characteristics of the audio signal. For example, the desired frequency characteristics are stored in the memory, etc. included in control device 10, for example. The maximum gain difference is set as a gain at the PEQ center frequency of equalizer 20. A specific example of the maximum gain difference will be described with reference to FIG. 4.

Figure 4:
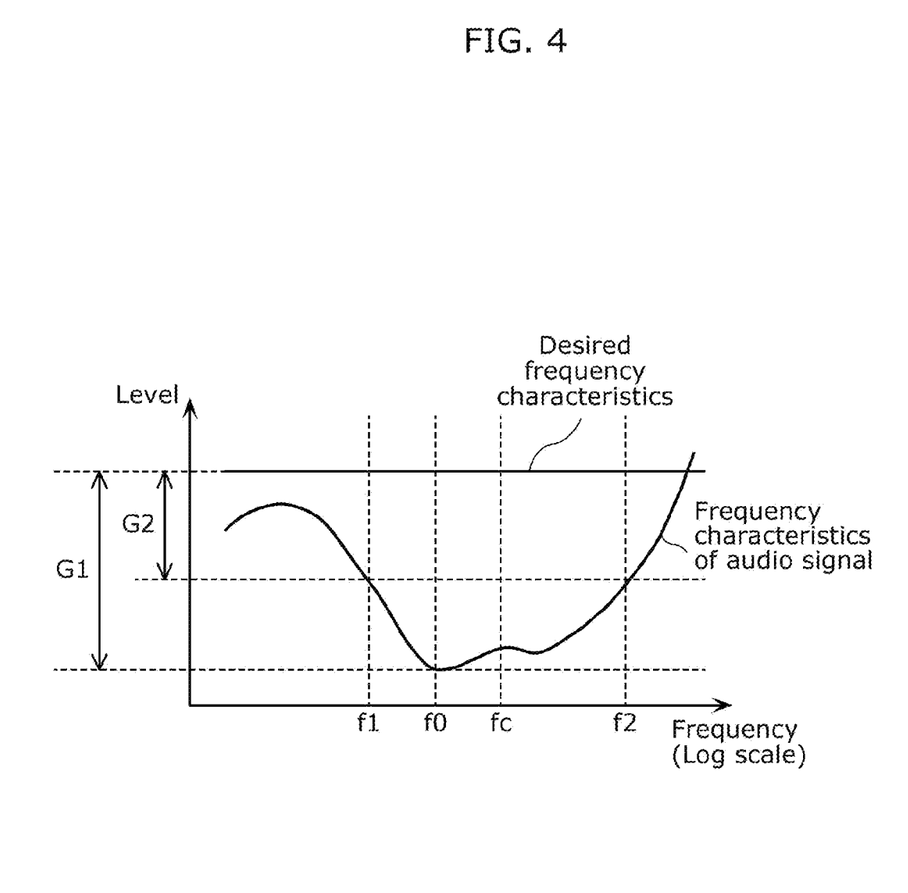
FIG. 4 is a graph showing an example of frequency characteristics of an audio signal and desired frequency characteristics.

FIG. 4 is a graph showing an example of frequency characteristics of an audio signal and desired frequency characteristics. In FIG. 4, the maximum gain difference is denoted as G1. The horizontal axis of the graph shown in FIG. 4 shows frequency and the vertical axis shows gain level. Note that the horizontal axis is shown in log scale. The same applies to FIG. 5 and FIG. 6, which will be described later. Note that in the following, flat characteristics are described as an example of the desired frequency characteristics, but the desired frequency characteristics may be characteristics in which the gain level changes according to frequency.

Figure 3:
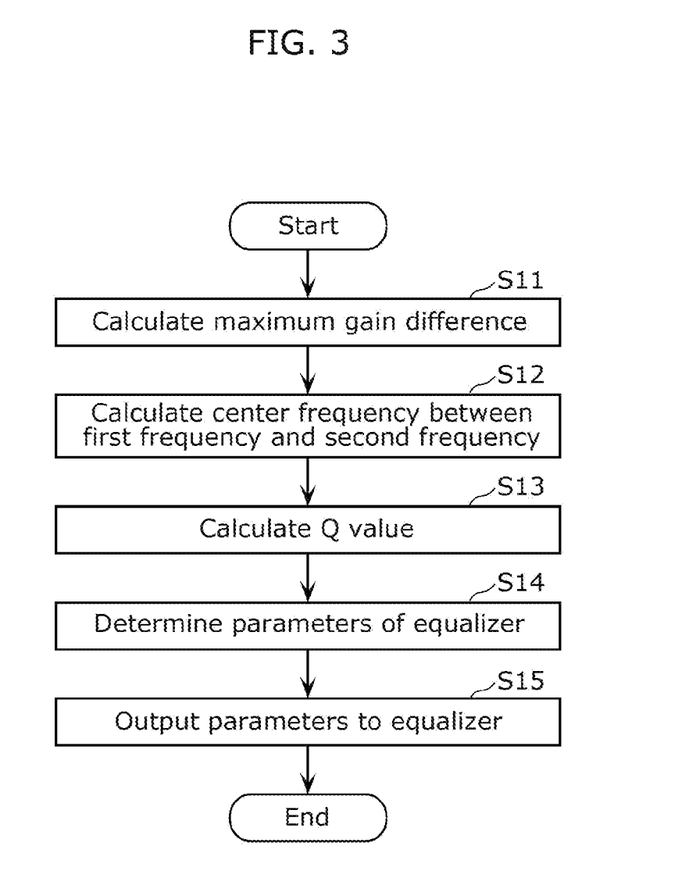
FIG. 3 is a flowchart illustrating an example of an operation of the control device according to the embodiment.

Returning to the description regarding FIG. 3, next, center frequency calculator 13 calculates a center frequency between a first frequency and a second frequency (step S12). The first frequency is a frequency at which a gain difference between the frequency characteristics of the audio signal and the desired frequency characteristics is $1/\sqrt{2}$ times the maximum gain difference and which is closest to a peak frequency among one or more frequencies lower than the peak frequency. The second frequency is a frequency at which a gain difference between the frequency characteristics of the audio signal and the desired frequency characteristics is $1/\sqrt{2}$ times the maximum gain difference and which is closest to the peak frequency among one or more frequencies higher than the peak frequency. The peak frequency is a frequency at which the maximum gain difference is obtained. The center frequency between the first frequency and the second frequency is set as the PEQ center frequency of equalizer 20. A specific example of the first frequency and the second frequency will be described with reference to FIG. 4.

In FIG. 4, the gain difference that is $1/\sqrt{2}$ times the maximum gain difference between the frequency characteristics of the audio signal and the desired frequency characteristics is denoted as G2, the peak frequency is denoted as f0, the first frequency is denoted as f1, the second frequency is denoted as f2, and the center frequency is denoted as fc. For example, center frequency fc between first frequency f1 and second frequency f2 is calculated by the following Expression 1.

[Math. 1]

$$fc = 10^{\{(log_{10}f1 + log_{10}f2)/2\}} \quad \text{(Expression 1)}$$

Note that center frequency fc is the center frequency between first frequency f1 and second frequency f2 on the frequency axis in log scale, as shown in Expression 1 and FIG. 4.

Returning to the description regarding FIG. 3, next, Q value calculator 14 calculates a Q value from the first frequency, the second frequency, and the center frequency (step S13). For example, the Q value is calculated using the following Expression 2.

[Math. 2]

$$Q = fc/(f2 - f1) \quad \text{(Expression 2)}$$

Next, determiner 15 determines parameters of equalizer 20 based on the maximum gain difference, the center frequency, and the Q value that have been calculated (step S14). Specifically, determiner 15 determines the maximum gain difference calculated as a gain at the PEQ center frequency of equalizer 20, determines the center frequency between the first frequency and the second frequency calculated as the PEQ center frequency of equalizer 20, and determines the calculated Q value as the Q value of equalizer 20.

Outputter 16 then outputs the determined parameters to equalizer 20 (step S15).

Here, the filter characteristics achieved by equalizer 20 are specifically described by giving a comparative example of the present embodiment.

First, filter characteristics according to the comparative example are described with reference to FIG. 5.

Figure 5:
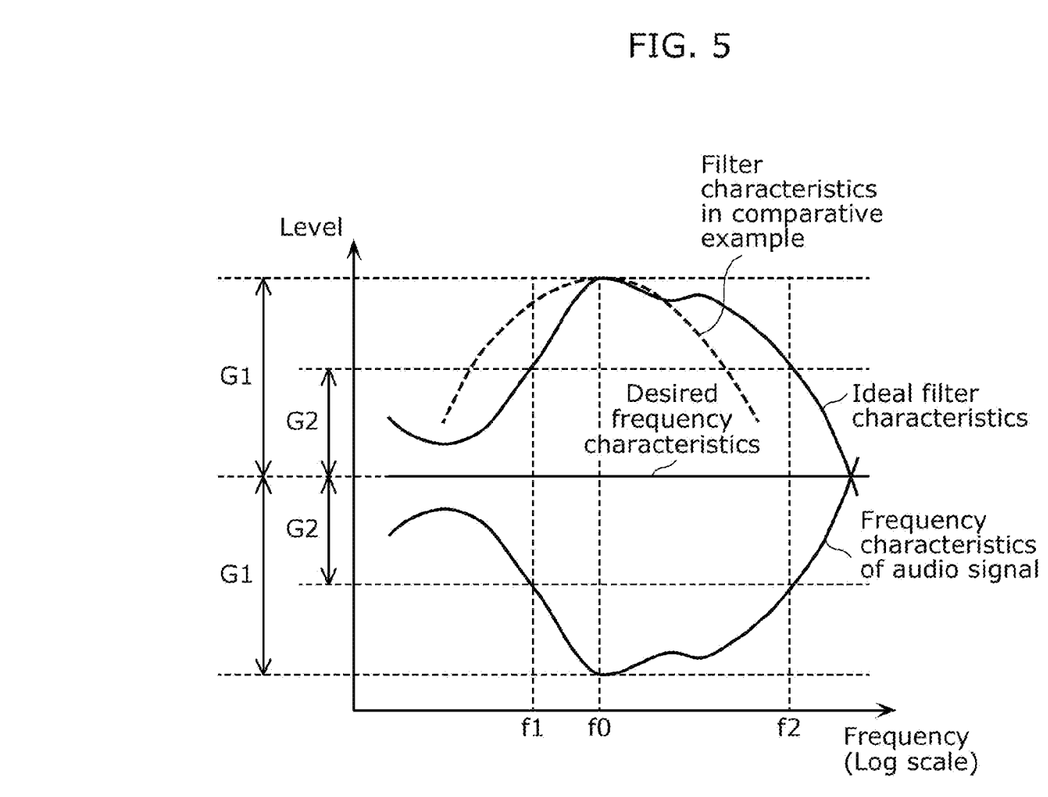
FIG. 5 is a graph for describing filter characteristics according to a comparative example.

FIG. 5 is a graph for describing the filter characteristics according to the comparative example.

In the comparative example, the PEQ center frequency of the filter characteristics achieved by equalizer 20 is set to peak frequency f0 of the frequency characteristics of an audio signal in a predetermined frequency band. In the comparative example, the gain at the PEQ center frequency of the filter characteristic achieved by equalizer 20 is set to a gain such that the gain difference at peak frequency f0 between the frequency characteristics of the audio signal and the desired frequency characteristics is zero. In the comparative example, the Q value of the filter characteristics achieved by equalizer 20 is set to a Q value calculated by the following Expression 3.

[Math. 3]

$$Q = f0/(f2-f1) \quad \text{(Expression 3)}$$

For example, the frequency characteristics of an audio signal are not always symmetrical about the peak frequency. For example, as shown in FIG. 5 and so on, there may be cases where an audio signal has frequency characteristics in which first frequency f1 and second frequency f2 are asymmetrical about peak frequency f0 on the frequency axis. In these cases, when the audio signal is corrected with the filter characteristics in which the PEQ center frequency is set to peak frequency f0 (i.e., the filter characteristics according to the comparative example), the audio signal is corrected too much at a certain frequency or not corrected enough at a certain frequency. For this reason, bands other than the band having such parameters may be required so as to approximate the frequency characteristics of the audio signal to desired frequency characteristics in a predetermined frequency band. For example, if a plurality of bands are used to correct one frequency band, a large number of bands are required to correct a whole specific frequency band that is wide as the audible band.

Next, filter characteristics according to the embodiment will be described with reference to FIG. 6.

Figure 6:
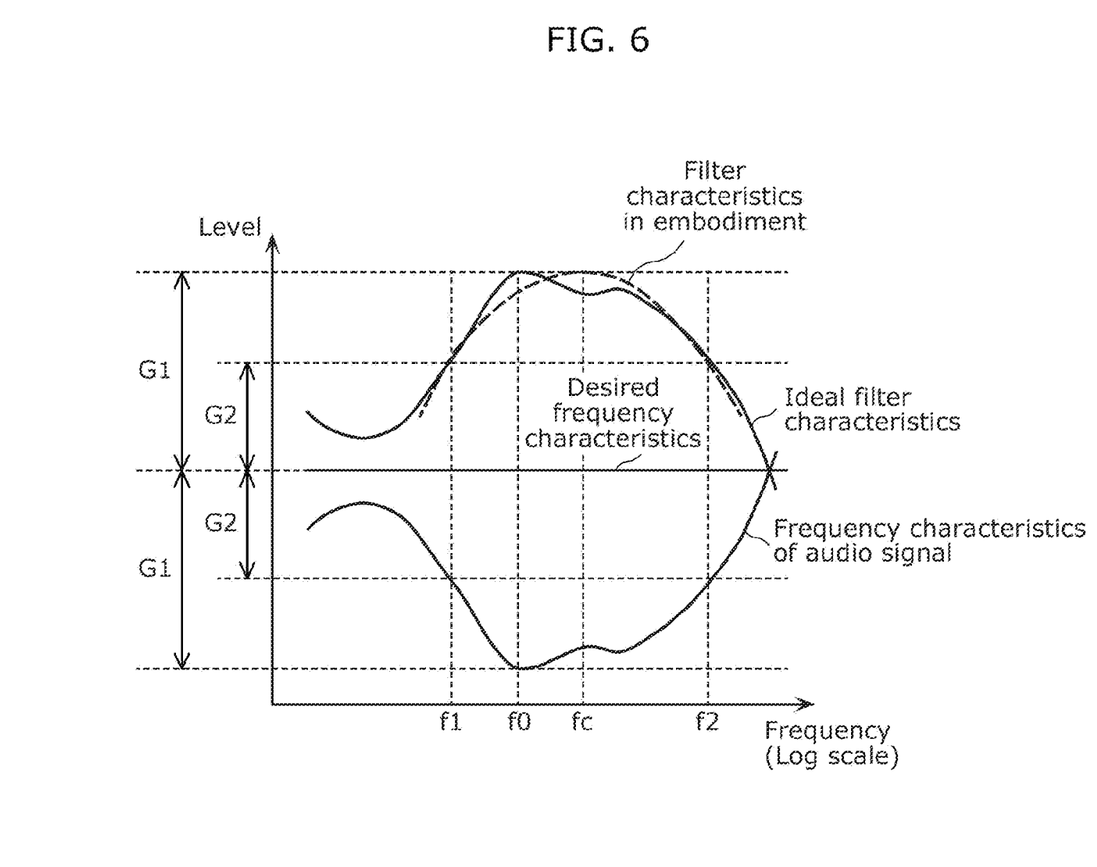
FIG. 6 is a graph for describing filter characteristics according to the embodiment.

FIG. 6 is a graph for describing the filter characteristics according to the embodiment.

In the embodiment, the PEQ center frequency of the filter characteristics achieved by equalizer 20 is set to center frequency fc between first frequency f1 and second frequency f2 as calculated by Expression 1 above. In the embodiment, the gain at the PEQ center frequency of the filter characteristics achieved by equalizer 20 is set to a gain such that the gain difference at peak frequency f0 between the frequency characteristics of the audio signal and the desired frequency characteristics is zero. In the embodiment, the Q value of the filter characteristics achieved by equalizer 20 is set to a Q value calculated by Expression 2 above.

As described above, the audio signal has frequency characteristics in which first frequency f1 and second frequency f2 are asymmetrical about peak frequency f0 on the frequency axis. However, in the embodiment, the center frequency of the filter characteristics to be achieved by equalizer 20 is set to center frequency fc between first frequency f1 and second frequency f2, instead of peak frequency f0. Therefore, this suppresses occurrence of a situation in which too much correction is made at a certain frequency or not enough correction is made at a certain frequency, and the overall frequency characteristics of the audio signal can be approximated to the desired frequency characteristics. Accordingly, the correction effect of equalizer 20 per band can be improved, and therefore this makes it possible to reduce the number of bands of equalizer 20 required for correction.

As described above, control device 10 includes: difference calculator 12 that calculates maximum gain difference G1 between frequency characteristics of an audio signal and desired frequency characteristics in a predetermined frequency band; center frequency calculator 13 that calculates center frequency fc between first frequency f1 and second frequency f2, first frequency f1 being a frequency at which a gain difference between the frequency characteristics of the audio signal and the desired frequency characteristics is $1/\sqrt{2}$ times maximum gain difference G1 and which is closest to peak frequency f0 among one or more frequencies lower than peak frequency f0, second frequency f2 being a frequency at which a gain difference between the frequency characteristics of the audio signal and the desired frequency characteristics is $1/\sqrt{2}$ times maximum gain difference G1 and which is closest to peak frequency f0 among one or more frequencies higher than peak frequency f0, peak frequency f0 being a frequency at which maximum gain difference G1 is obtained; determiner 15 that determines parameters of equalizer 20 that adjusts the frequency characteristics of the audio signal based on maximum gain difference G1 and center frequency fc; and outputter 16 that outputs the parameters to equalizer 20.

With this, as parameters of equalizer 20, for example, the PEQ center frequency is set to center frequency fc of first frequency f1 and second frequency f2, instead of peak frequency f0. Therefore, even when first frequency f1 and second frequency f2 are asymmetrical about peak frequency f0 on the frequency axis, the overall frequency characteristics of the audio signal can be approximated to the desired frequency characteristics. Therefore, the number of bands of equalizer 20 required for correction can be reduced.

For example, center frequency fc may be calculated by Expression 1 above, where f1 is the first frequency, f2 is the second frequency, and fc is the center frequency. In other words, center frequency fc may be the center frequency between first frequency f1 and second frequency f2 on the frequency axis in log scale.

For example, control device 10 further includes Q value calculator 14 that calculates a Q value. Determiner 15 determines parameters based on maximum gain difference G1, center frequency fc, and the Q value. The Q value may be calculated by Expression 2 above, where f1 is the first frequency, f2 is the second frequency, fc is the center frequency, and Q is the Q value.

Other Embodiments

As described above, the embodiment has been described as an example of the technique disclosed in the present application. However, the technique in the present disclosure is not limited to the embodiment and is also applicable to embodiments including changes, replacements, additions, omissions, and other modifications as appropriate. The structural elements described in the above embodiments can be combined with one another to create a new embodiment.

For example, control device 10 may determine the parameters of the bands included in equalizer 20 by the procedure described below. Note that it is assumed that the audio signal is corrected with the bands included in equalizer 20 for each of the frequency bands obtained by dividing a wide specific frequency band, such as the audible band. As an example, a plurality of frequency bands obtained by dividing a specific frequency band are named as a first frequency band, a second frequency band, and a third frequency band.

First, among the first frequency band, the second frequency band, and the third frequency band in the specific frequency band, control device 10 determines, as a predetermined frequency band, a frequency band (for example, the first frequency band) including a frequency at which a gain difference between the frequency characteristics of an audio signal and desired frequency characteristics is maximum. For example, the first frequency band includes the frequency at which the gain difference between the frequency characteristics of the audio signal and the desired frequency characteristics is maximum. Control device 10 determines the first frequency band to be a predetermined frequency band, and determines parameters of one of the plurality of bands included in equalizer 20 for the first frequency band. Next, control device 10 obtains a corrected audio signal obtained by correcting the audio signal with the one band. Among the first frequency band, the second frequency band, and the third frequency band in the predetermined frequency band, control device 10 determines a frequency band including a frequency at which the gain difference between the frequency characteristics of the corrected audio signal and the desired frequency characteristics is maximum to be a next predetermined frequency band. Control device 10 determines parameters of another one of the bands included in equalizer 20 for the next predetermined frequency band. Here, there may be cases where the audio signal is not sufficiently corrected for the first frequency band with one band, and the first frequency band includes a frequency at which the gain difference between the frequency characteristics of the corrected audio signal and the desired frequency characteristics is maximum. In these cases, control device 10 again determines parameters of another one of the bands included in equalizer 20 for the first frequency band. By repeating this, control device 10 corrects the audio signal for each of the first frequency band, the second frequency band, and the third frequency band, with the bands included in equalizer 20. In this way, the frequency characteristics of the audio signal may be gradually approximated to the desired frequency characteristics for the whole specific frequency band.

For example, the above embodiment has described an example of control device 10 including Q value calculator 14, but it is not necessary to include Q value calculator 14. In this case, determiner 15 may determine parameters of equalizer 20 based on the maximum gain difference calculated by difference calculator 12 and the center frequency calculated by center frequency calculator 13. In this case, a fixed value may be set as the Q value of equalizer 20.

For example, the above embodiment has described an example in which the center frequency between the first frequency and the second frequency is the center frequency between the first frequency and the second frequency on the frequency axis in log scale, but this is not limiting. For example, the center frequency between the first frequency and the second frequency may be a center frequency between the first frequency and the second frequency on the frequency axis in linear scale.

The present disclosure may be achieved not only as control device 10, but also as a control method that includes steps (processing operations) performed by the structural elements included in control device 10.

Specifically, as illustrated in FIG. 3, the control method includes: calculating a maximum gain difference between frequency characteristics of an audio signal and desired frequency characteristics in a predetermined frequency band (step S11); calculating a center frequency between a first frequency and a second frequency (step S12), the first frequency being a frequency at which a gain difference between the frequency characteristics of the audio signal and the desired frequency characteristics is $1/\sqrt{2}$ times the maximum gain difference and which is closest to a peak frequency among one or more frequencies lower than the peak frequency, the second frequency being a frequency at which a gain difference between the frequency characteristics of the audio signal and the desired frequency characteristics is $1/\sqrt{2}$ times the maximum gain difference and which is closest to the peak frequency among one or more frequencies higher than the peak frequency, the peak frequency being a frequency at which the maximum gain difference is obtained; determining parameters of an equalizer that adjusts the frequency characteristics of the audio signal based on the maximum gain difference and the center frequency (step S14); and outputting the parameters to the equalizer (step S15).

For example, the control method may be performed by a computer (computer system). The present disclosure can be achieved as a program for causing a computer to execute the steps included in the control method. In addition, the present disclosure can be achieved as a non-transitory computer-readable recording medium, such as a CD-ROM having the program recorded thereon.

For example, if the present disclosure is achieved by a program (software), each step is executed by the program by using hardware resources such as a CPU, memory, and an input/output circuit of a computer. In other words, each step is performed by the CPU obtaining data from, for example, the memory or the input/output circuit and calculating the data, and outputting a calculation result to the memory or the input/output circuit, for example.

Moreover, the structural elements included in control device 10 according to the embodiment may be achieved as large scale integration (LSI), which is an integrated circuit (IC).

Moreover, the integrated circuit is not limited to LSI, but may be achieved by a dedicated circuit or a general-purpose processor. Programmable FPGAs or reconfigurable processors that can reconfigure the connection and configuration of circuit cells inside the LSI may be used.

Furthermore, if the technology for integrated circuits replaces LSIs due to advances in semiconductor technology or other derived technologies, it is not surprising that the integrated circuits of the structural elements included in control devices 10 may be implemented using that technology.

As described above, the embodiment has been described as an example of the technique in the present disclosure. For such a purpose, the accompanying drawings and the detailed description have been provided.

The structural elements described in the accompanying drawings and the detailed description may therefore include not only essential structural elements for achievement of the object but also structural elements that are not essential to achieve the object and are provided to describe the technology described above. The inclusion of such optional structural elements in the detailed description and the accompanying drawings therefore does not mean that these optional structural elements are essential structural elements.

The foregoing embodiment is intended to be illustrative of the disclosed techniques. Therefore, various changes, replacements, additions, omissions, etc. can be made within the scope of the appended claims and their equivalents.

INDUSTRIAL APPLICABILITY

The present disclosure is applicable to, for example, devices that correct audio signals with PEQ.

The invention claimed is:

1. A control device comprising:
a difference calculator that calculates a maximum gain difference between frequency characteristics of an audio signal and desired frequency characteristics in a predetermined frequency band;
a center frequency calculator that calculates a center frequency between a first frequency and a second frequency, the first frequency being a frequency at which a gain difference between the frequency characteristics of the audio signal and the desired frequency characteristics is $1/\sqrt{2}$ times the maximum gain difference and which is closest to a peak frequency among one or more frequencies lower than the peak frequency, the second frequency being a frequency at which a gain difference between the frequency characteristics of the audio signal and the desired frequency characteristics is $1/\sqrt{2}$ times the maximum gain difference and which is closest to the peak frequency among one or more frequencies higher than the peak frequency, the peak frequency being a frequency at which the maximum gain difference is obtained;
a determiner that determines parameters of an equalizer that adjusts the frequency characteristics of the audio signal based on the maximum gain difference and the center frequency; and
an outputter that outputs the parameters to the equalizer.

2. The control device according to claim 1, wherein the center frequency is calculated by the following expression:

$$fc=10^{\{(log_{10}f1+log_{10}f2)/2\}},$$ [Math. 1]

where f1 is the first frequency, f2 is the second frequency, and fc is the center frequency.

3. The control device according to claim 1, further comprising:
a Q value calculator that calculates a Q value,
wherein the determiner determines the parameters based on the maximum gain difference, the center frequency, and the Q value, and
the Q value is calculated by the following expression:

$$Q=fc/(f2-f1),$$ [Math. 2]

where f1 is the first frequency, f2 is the second frequency, fc is the center frequency, and Q is the Q value.

4. A control method comprising:
calculating a maximum gain difference between frequency characteristics of an audio signal and desired frequency characteristics in a predetermined frequency band;
calculating a center frequency between a first frequency and a second frequency, the first frequency being a frequency at which a gain difference between the frequency characteristics of the audio signal and the desired frequency characteristics is $1/\sqrt{2}$ times the maximum gain difference and which is closest to a peak frequency among one or more frequencies lower than the peak frequency, the second frequency being a frequency at which a gain difference between the frequency characteristics of the audio signal and the desired frequency characteristics is $1/\sqrt{2}$ times the maximum gain difference and which is closest to the peak frequency among one or more frequencies higher than the peak frequency, the peak frequency being a frequency at which the maximum gain difference is obtained;
determining parameters of an equalizer that adjusts the frequency characteristics of the audio signal based on the maximum gain difference and the center frequency; and
outputting the parameters to the equalizer.

5. A non-transitory computer-readable recording medium for use in a computer, the recording medium having a program recorded thereon for causing the computer to execute the control method according to claim 4.

* * * * *